United States Patent
Arvin et al.

(10) Patent No.: US 10,192,839 B2
(45) Date of Patent: Jan. 29, 2019

(54) CONDUCTIVE PILLAR SHAPED FOR SOLDER CONFINEMENT

(71) Applicant: International Business Machines Corporation, Armonk, NY (US)

(72) Inventors: Charles L. Arvin, Savannah, GA (US); Jeffrey P. Gambino, Portland, OR (US); Christopher D. Muzzy, Burlington, VT (US); Wolfgang Sauter, Eagle-Vail, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/829,506

(22) Filed: Dec. 1, 2017

(65) Prior Publication Data
US 2018/0082968 A1    Mar. 22, 2018

Related U.S. Application Data

(63) Continuation of application No. 15/403,797, filed on Jan. 11, 2017, now Pat. No. 9,911,708, which is a
(Continued)

(51) Int. Cl.
*H01L 23/00* (2006.01)

(52) U.S. Cl.
CPC .............. *H01L 24/13* (2013.01); *H01L 24/03* (2013.01); *H01L 24/11* (2013.01); *H01L 24/16* (2013.01); *H01L 24/81* (2013.01); *H01L 2224/0345* (2013.01); *H01L 2224/0401* (2013.01); *H01L 2224/05* (2013.01); *H01L 2224/05166* (2013.01); *H01L 2224/05187* (2013.01); *H01L 2224/05647* (2013.01); *H01L 2224/10126* (2013.01); *H01L 2224/11001* (2013.01);
(Continued)

(58) Field of Classification Search
CPC ......... H01L 24/13; H01L 24/16; H01L 24/11; H01L 24/81; H01L 24/03
See application file for complete search history.

(56) References Cited

U.S. PATENT DOCUMENTS

| | | | |
|---|---|---|---|
| 8,318,596 B2 | 11/2012 | Kuo et al. | |
| 8,803,319 B2 | 8/2014 | Kuo et al. | |

(Continued)

FOREIGN PATENT DOCUMENTS

| | | |
|---|---|---|
| JP | 2013201156 A | 10/2013 |
| TW | 2008186428 A | 4/2008 |
| TW | 200917436 A | 4/2009 |

OTHER PUBLICATIONS

Tung et al., "Flip-chip Bonding Alignment Accuracy Enhancement using Self-aligned Interconnection Elements to Realize Low-temperature Construction of Ultrafine-pitch Copper Bump Interconnections," IEEE 2014 Electronic Components & Technology Conference, pp. 62-67.

(Continued)

*Primary Examiner* — Anthony Ho
(74) *Attorney, Agent, or Firm* — Sherman IP LLP; Kenneth L. Sherman; Steven Laut

(57) ABSTRACT

A method of fabricating a pillar-type connection includes forming a first conductive layer. A second conductive layer is formed on the first conductive layer to define a conductive pillar that includes a top surface defining a recess aligned with a hollow core of the first conductive layer. A conductive via that terminates at a top surface of the first conductive layer is formed.

10 Claims, 5 Drawing Sheets

Related U.S. Application Data continuation of application No. 14/744,495, filed on Jun. 19, 2015, now Pat. No. 9,583,451.

(52) U.S. Cl.
CPC ............ *H01L 2224/1147* (2013.01); *H01L 2224/11462* (2013.01); *H01L 2224/131* (2013.01); *H01L 2224/13011* (2013.01); *H01L 2224/13019* (2013.01); *H01L 2224/13026* (2013.01); *H01L 2224/13082* (2013.01); *H01L 2224/13083* (2013.01); *H01L 2224/13084* (2013.01); *H01L 2224/13111* (2013.01); *H01L 2224/13147* (2013.01); *H01L 2224/13155* (2013.01); *H01L 2224/16227* (2013.01); *H01L 2224/16238* (2013.01); *H01L 2224/81141* (2013.01); *H01L 2224/81143* (2013.01); *H01L 2224/81815* (2013.01); *H01L 2924/01029* (2013.01); *H01L 2924/381* (2013.01)

(56) References Cited

U.S. PATENT DOCUMENTS

| | | |
|---|---|---|
| 8,921,222 B2 | 12/2014 | Kuo et al. |
| 9,583,451 B2 | 2/2017 | Arvin et al. |
| 2013/0056869 A1 | 3/2013 | Kuo et al. |

OTHER PUBLICATIONS

Chung et al., "Bump Shape Control on High Speed Copper Pillar Plating Process in Lead-Free Wafer Level Packaging," 2009 IEEE IMPACT Conference, pp. 432-435.

Lin et al., "Evaluation of Cu-bumps with lead-free solders for flip-chip package applications," Microelec. Eng., vol. 86, 2009, pp. 2392-2395.

Gerber et al., "Next Generation Fine Pitch Cu Pillar Technology—Enabling Next Generation Silicon Nodes," 2011 Electronic Components and Technology Conference, pp. 612-618.

List of IBM Patents or Applications Treated as Related.

CONDUCTIVE PILLAR SHAPED FOR SOLDER CONFINEMENT

BACKGROUND

A chip or die includes integrated circuits formed by front-end-of-line processing using the semiconductor material of a wafer, a local interconnect level formed by middle-end-of-line processing, and stacked metallization levels of an interconnect structure formed by back-end-of line processing.

After singulation from the wafer, chips may be packaged using a controlled collapse chip connection or flip chip process. Solder bumps provide mechanical and electrical connections between bond pads in the last or top metallization level and the package. The solder bumps establish physical attachment and electrical contact between the bond pads and a complementary array of bond pads on a package.

Conductive pillars are a next generation flip chip interconnect technology that is competitive with solder bumps. Fine-pitch conductive pillars are capable of providing improved thermal and electrical performance, compared to solder interconnects, in smaller geometries and at tighter pitches.

In addition, conductive pillars reduce the amount of solder required to form the mechanical and electrical connections between bond pads in the top metallization level and the package.

SUMMARY

In one embodiment, a method of fabricating a pillar-type connection includes forming a first conductive layer. A second conductive layer is formed on the first conductive layer to define a conductive pillar that includes a top surface defining a recess aligned with a hollow core of the first conductive layer. A conductive via that terminates at a top surface of the first conductive layer is formed.

BRIEF DESCRIPTION OF THE DRAWINGS

The accompanying drawings, which are incorporated in and constitute a part of this specification, illustrate various embodiments and, together with a general description of the embodiments given above and the detailed description of the embodiments given below, serve to explain the embodiments.

DETAILED DESCRIPTION

Figure 1:
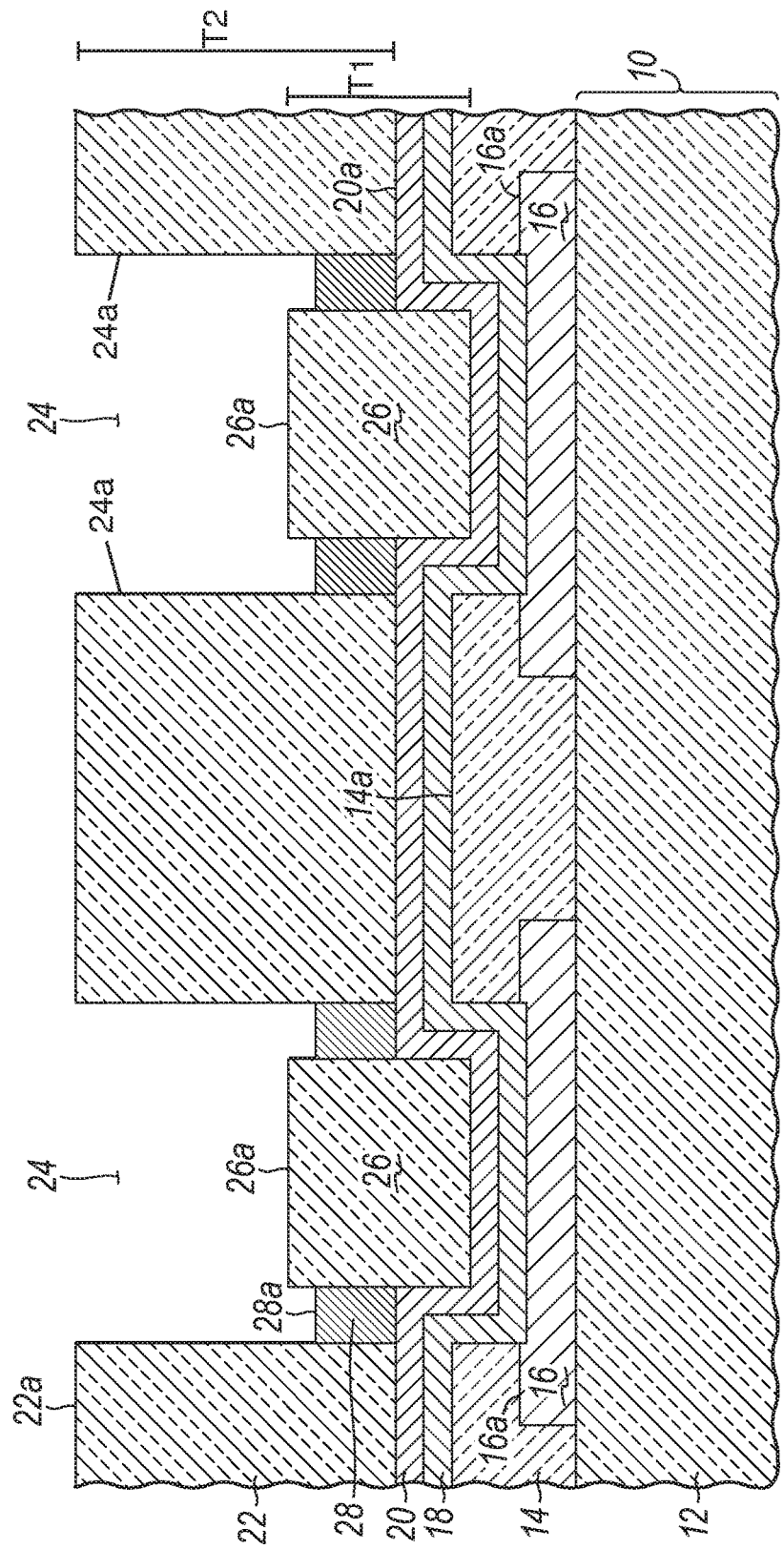
FIGS. 1-4 are cross-sectional views of a portion of a substrate at successive stages of a processing method for fabricating a device structure in accordance with an embodiment.

With reference to FIG. 1 and in accordance with an embodiment, a topmost metallization level of a back-end-of-line (BEOL) interconnect structure, generally indicated by reference numeral 10, includes a dielectric layer 12, a passivation layer 14, and bond pads 16. The BEOL interconnect structure 10 is carried on a die or chip diced from a wafer that has been processed by front-end-of-line processes to fabricate one or more integrated circuits that contain device structures and middle-end-of line processes to fabricate a local interconnect structure. The chip may be formed using a wafer of a semiconductor material (e.g., silicon) suitable for integrated circuit fabrication. The front-end-of-line processes may comprise complementary-metal-oxide-semiconductor (CMOS) processes build a combination of p-type and n-type metal-oxide-semiconductor field-effect transistors (MOSFETs) to implement logic gates and other types of digital circuits. Typical constructions for the BEOL interconnect structure 10 include multiple metallization levels arranged in a stack. The metallization levels of the BEOL interconnect structure 10 may be formed by deposition, lithography, etching, and polishing techniques characteristic of damascene processes.

The bond pads 16 may be comprised of copper, aluminum, or an alloy of these metals. The bond pads 16 may be arranged in pattern, such as an array characterized by columns and rows. Each of the layers 12, 14 may be comprised of an organic or inorganic dielectric material that is an electrical insulator with an electrical resistivity at room temperature of greater than $10^{10}(!1-m)$ is deposited. Candidate inorganic dielectric materials for one or both of the layers 12, 14 may include, but are not limited to, silicon nitride (ShN4), silicon dioxide (SiO2), fluorine-doped silicon glass, or combinations of these dielectric materials. A candidate organic dielectric material for one or both of the layers 12, 14 may be an organic material, such as polyimide, operating as a passivation layer. Layers 12, 14 may be deposited by any number of techniques including, but not limited to, sputtering, spin-on application, or chemical vapor deposition.

A barrier layer 18 and a seed layer 20 cover a top surface 16a of the bond pads 16 and a top surface 14a of the passivation layer 14 adjacent to the bond pads 16. The seed layer 20 may directly contact the barrier layer 18 so that layers 18, 20 are in physical and electrical contact. A portion of the barrier layer 18 is in physical and electrical contact with the bond pads 16, and may function as a diffusion barrier in addition to promoting the adhesion of the seed layer 20 with the bond pads 16. The barrier layer 18 may be comprised of titanium (Ti), titanium nitride (TiN), tungsten nitride (WN), or a multilayer combination of these and other materials. In one embodiment, seed layer 20 may be comprised of copper (Cu), such as elemental Cu or co-deposited chromium-copper (Cr—Cu). The layers 18, 20 of the layer stack may be serially formed with a conformal layer thickness by, for example, physical vapor deposition (PVD).

The thickness of the layers 18, 20 may be less than depicted in the representative embodiment such that the topography of the top surface of the seed layer 20 is less pronounced than illustrated. In an alternative embodiment, the passivation layer 14 may be omitted to reduce the topography of the top surface of the seed layer 20 and increase planarity. In an alternative embodiment, the bond pad 16 may be have the form of a conductive via that terminates at the top surface of dielectric layer 12 instead of being formed on the top surface of dielectric layer 12, which would also reduce the surface topography and provide a more planar surface.

A patterned plating mask 22 is formed on a top surface 20a of the seed layer 20. The plating mask 22 may be comprised of a layer of sacrificial material that is applied and photolithographically patterned. For example, the plating mask 22 may be comprised of a photoresist layer that is applied by a spin coating process, pre-baked, exposed to a radiation projected through a photomask, baked after exposure, and developed with a chemical developer to define openings 24 in the photoresist layer that are respectively aligned with the bond pads 16. The patterned plating mask 22 further includes sacrificial plugs 26 that are respectively positioned inside the openings 24 and that contact the top surfaces of the seed layer 20. The sacrificial plugs 26 are also aligned with the bond pads 16 and, in the representative embodiment, are centered relative to the bond pads 16. The sacrificial plugs 26 have a height or thickness T1 that is less than the height or thickness T2 of the plating mask 22 in which the openings 24 are formed. The reduced thickness is the result of the selection of photolithography process.

To provide the sacrificial plugs 26 of reduced thickness relative to the rest of the plating mask 22, the patterned plating mask 22 may be formed using a half-tone photomask. Such half-tone photomasks are binary masks that achieve a greyscale effect with multiple transmission levels when used in conjunction with an appropriate optical system. For example, a half-tone photomask may include a pattern of transparent small apertures in an opaque chrome layer in which these apertures have dimensions smaller than the resolution limit of the optical exposure system so as to not to be not be directly transferred to the photoresist. The different light zones of half-tone photomask provide the sacrificial plugs 26 as well as the surrounding primary layer in which the openings 24 are formed. In an alternative embodiment, the sacrificial plugs 26 may be formed as part of a different plating mask 22 formed using another photomask.

A conductive layer 28 is formed that partially fills and adopts the geometrical shape and the pattern of the openings 24 of the plating mask 22. The conductive layer 28 may be comprised of a conductor such as a low-resistivity metal or metal alloy like copper, and may be formed by a deposition process, such as an electrochemical plating process like electroplating. In an electrochemical plating process, the seed layer 20 functions to nucleate the formation of the conductor constituting the conductive layer 28. The material in seed layer 20 may be subsumed during the deposition process, such that the seed layer 20 may become continuous with or blend into conductive layer 28. The conductive layer 28 does not deposit on the material comprising the plating mask 22.

The deposition of the conductive layer 28 within the openings 24 is interrupted before the thickness of the conductive layer 28 reaches the top surfaces 26a of the sacrificial plugs 26. The thickness of the conductive layer 28 is thus controlled during deposition such that the top surface 28a of the conductive layer 28 is located in a plane below a plane containing the top surfaces 26a of the sacrificial plugs 26. As a result, the thickness of the conductive layer 28 is less than the thickness T1 of the sacrificial plugs 26.

The core of the conductive layer 28 inside each of the openings 24 is hollow and unfilled by the conductor from the conductive layer 28 because of the presence of the sacrificial plugs 26 during deposition. Inside each opening 24, the conductive layer 28 is located between the sidewalls 24a of the plating mask 22 bordering the opening 24 and the sacrificial plug 26 such that the conductive layer 28 covers a portion of the bond pad 16 in a space between the plating mask 22 surrounding the opening 24 and the sacrificial plug 26. The conductive layer 28 inside each opening 24 is physically and electrically coupled with one or the other of the bond pads 16.

Figure 2:
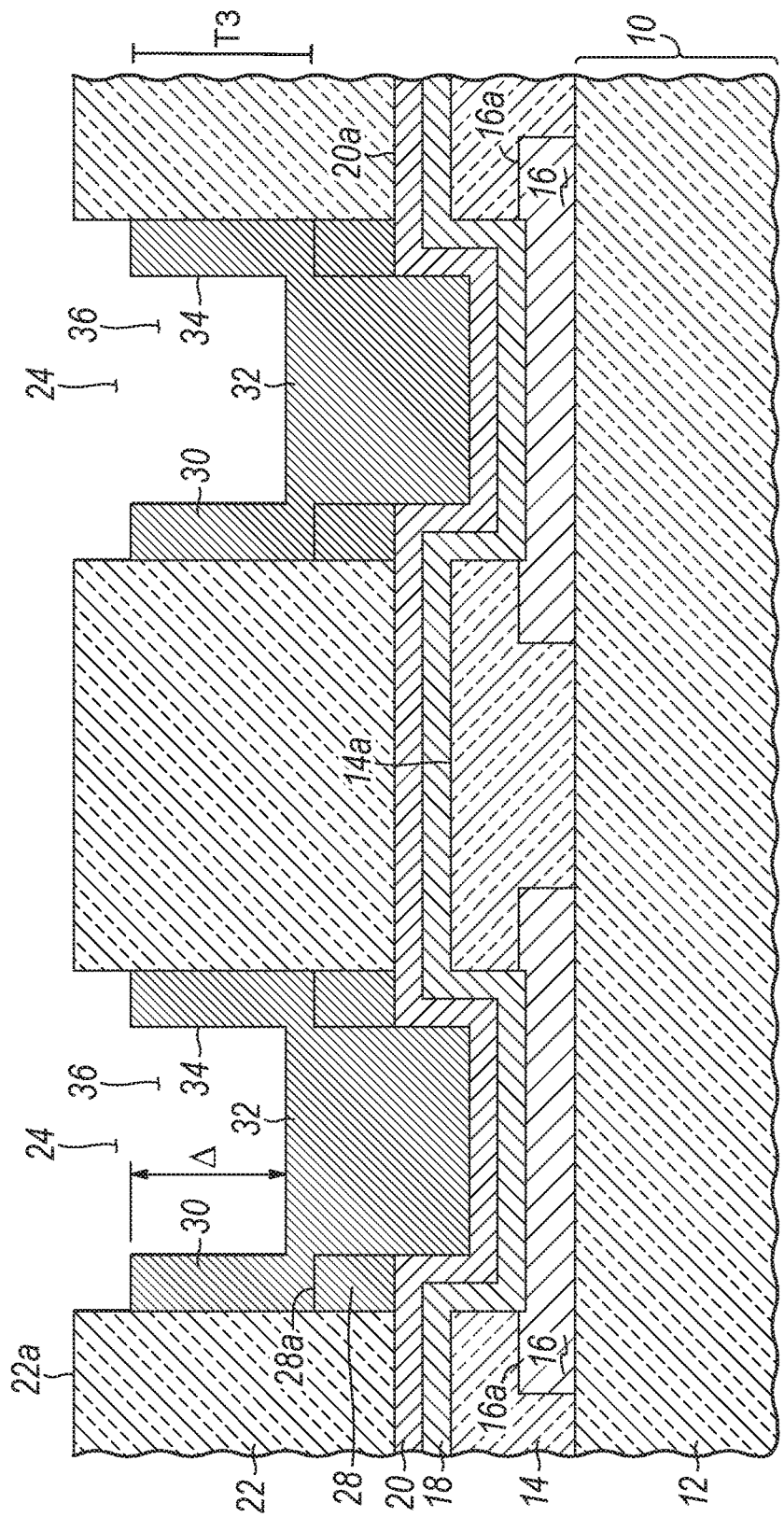

With reference to FIG. 2 in which like reference numerals refer to like features in FIG. 1 and at a subsequent fabrication stage, the plating mask 22 is partially removed after the conductive layer 28 is formed. If comprised of a photoresist, the plating mask 22 may be partially removed by ashing with an oxygen plasma. The partial removal of the plating mask 22 may be timed to remove the thinner sacrificial plugs 26 while leaving the regions of the plating mask 22 that define the openings 24. The top surface 22a of the plating mask 22 is recessed relative to the conductive layer 28 and its top surface 28a.

A conductive layer 30 is formed inside of the openings 24 after the partial removal of the plating mask 22. The conductive layer 30 is formed on conductive layer 28, which operates as a growth seed. The conductive layer 30 has a height or thickness T3 that is additive to the thickness of conductive layer 28. A height difference Δ is present between a portion of the conductive layer 30 coextensive with the sidewalls 24a of the openings 24 and a portion 32 of the conductive layer 30 occupying the hollow core opened when the sacrificial plugs 26 are removed. Another portion 32 of the conductive layer 30 fills the hollow core inside the conductive layer 28 inside each opening 24 that is opened when the sacrificial plug 26 is removed.

The conductive layer 30 inside each opening 24 has a non-planar top surface 34 that defines a cup-shaped recess 36 with a height given the height difference Δ. Vertical sections of the non-planar top surface 34 are aligned parallel to the sidewalls 24a (FIG. 1) of the opening 24 in the plating mask 22 and a horizontal section of the non-planar top surface 34 at the base of the cup-shaped recess 36 connects the vertical sections to define the contour of the cup shape. The dimensions of the sacrificial plugs 26 and/or the height of the hollow conductive layer 28 before the sacrificial plugs 26 are removed and the conductive layer 30 is deposited may be among the factors that are determinative of the shape of the non-planar surface 34 and recesses 36. The topography of the conductive layer 30 reproduces the topography of the conductive layer 28. For example, the recess 36 in the conductive layer 30 is aligned with the hollow core of the conductive layer 28 formerly occupied by the sacrificial plug 26.

The conductive layer 30 may be comprised of a conductor. In an embodiment, the composition of the conductor comprising the conductive layer 30 may be the same as the composition of the conductor comprising the conductive layer 28 (e.g., copper deposited by electroplating). In an alternative embodiment, the conductive layer 30 may have a different composition from the conductive layer 28, which is possible because of the multiple depositions used to form the conductive layers 28, 30.

The formation of the cup-shaped recess 36 defined by the non-planar top surface 34 is independent of the shape of the topography of the seed layer 20, which is created by the underlying topography of the bond pads 16 and the passivation layer 14 surrounding the bond pads 16. The deposition of multiple conductive layers 28, 30 coupled with the presence of the sacrificial plugs 26 when conductive layer 28 is deposited and the removal of the sacrificial plugs 26 before conductive layer 30 is deposited provides the non-planar top surface 34.

Figure 3:
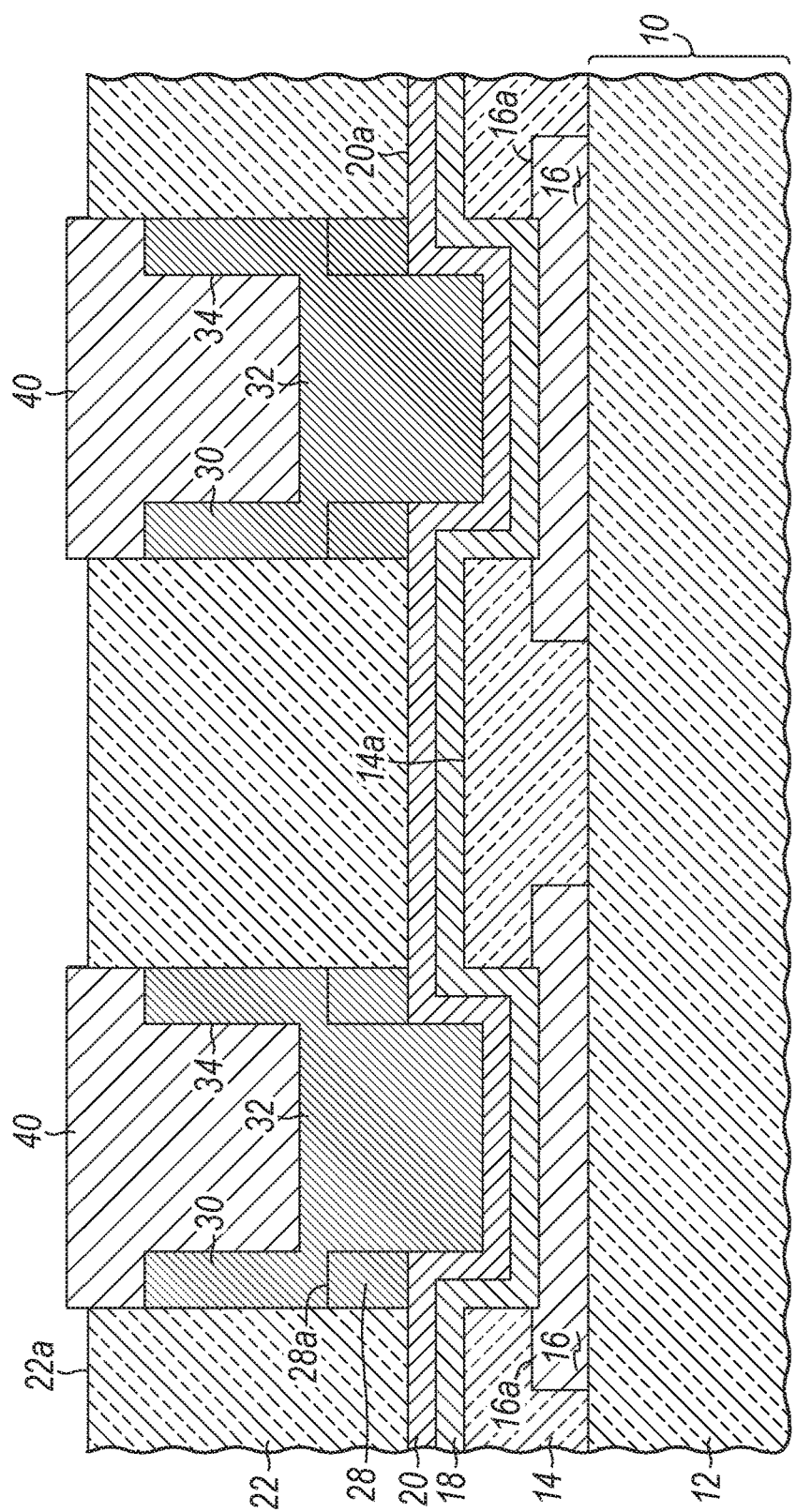

With reference to FIG. 3 in which like reference numerals refer to like features in FIG. 2 and at a subsequent fabrication stage, a solder body 40 is formed in contact with the non-planar top surface 34 inside each of the openings 24. The solder body 40 may fill the recess 36 to cover the conductive layer 30. The solder body 40 may be comprised of solder having a conventional lead-free (Pb-free) composition, which may include tin (Sn) as the primary elemental component. In a representative embodiment, the solder body 40 may be formed by electroplating using an appropriate plating solution, anode and cathode, and direct current. Before forming the solder body 40, a barrier layer of, for example, nickel (Ni) or a Ni alloy (e.g., NiCo) may be deposited protect the material (e.g., Cu) of the conductive layer 28 against consumption from reactions with the solder body 40 during reflow processes.

Figure 4:
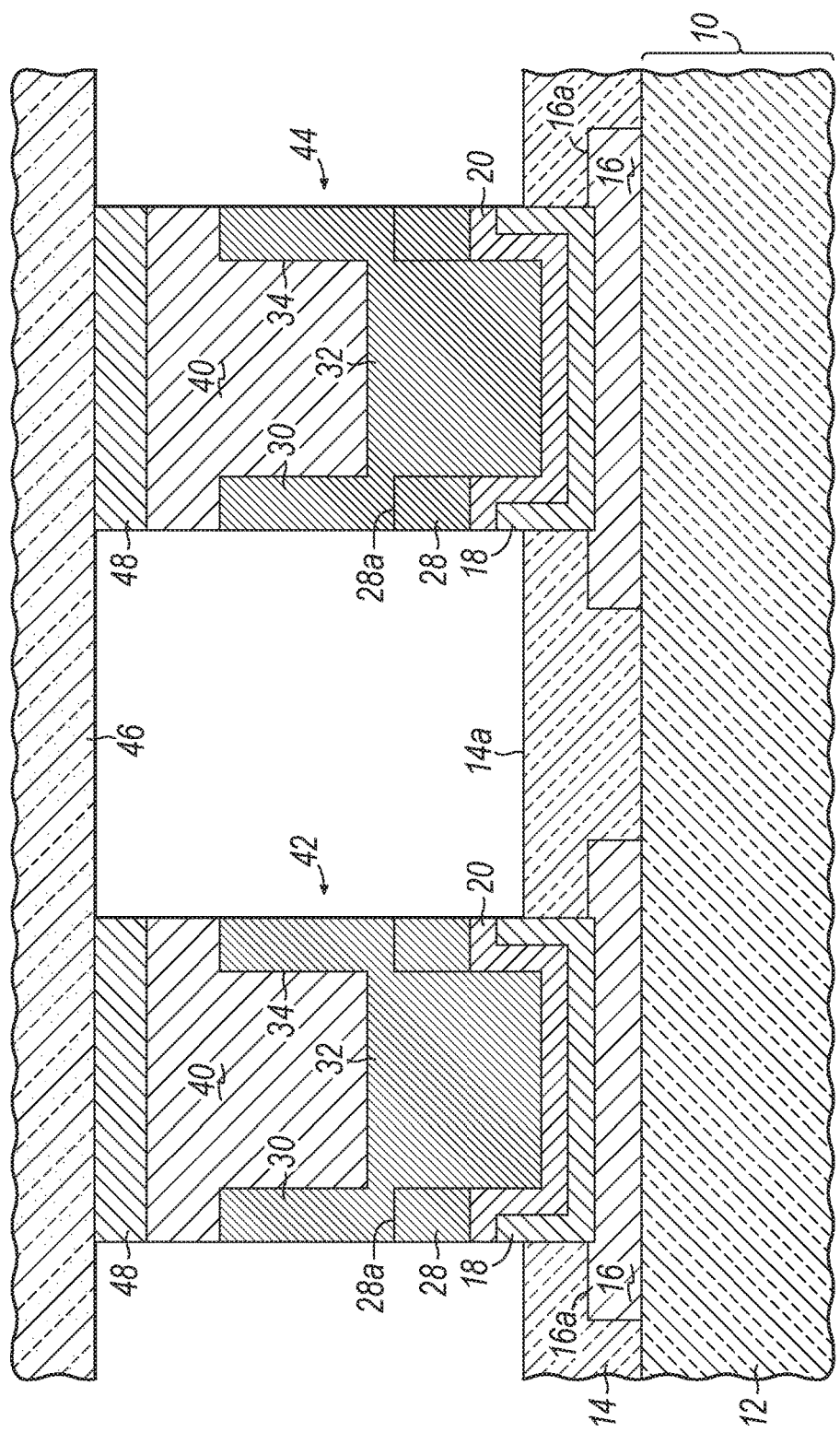

With reference to FIG. 4 in which like reference numerals refer to like features in FIG. 3 and at a subsequent fabrication stage, the remainder of the mask layer is removed (e.g., by ashing or solvent stripping if the mask layer is comprised of photoresist) after the solder bodies 40 are formed, followed by a cleaning process. The resulting distinct pillars 42, 44 are pillar-type connections comprised of the conductor(s) of the conductive layers 28, 30. Each of the pillars 42, 44 is crowned on its top surface 34 by one of the solder bodies 40. Pillar 42 forms a distinct pillar-type connection linking the bond pad 16 with its associated solder body 40. Pillar 44 forms another distinct pillar-type connection linking the bond pad 16 with its associated solder body 40.

The field regions of the barrier layer 18 and seed layer 20 may be removed from areas on the top surface 14a of passivation layer 14 that are not covered by the pillars 42, 44. The etching process may be selected to stop on the passivation layer 14. After removal, the pillars 42, 44 are electrically isolated from each other by the passivation layer 14. The thickness or height of the pillars 42, 44 formed from the conductive layers 28, 30 may range from 20 micrometers to 70 micrometers, which is considerably thicker than either of the layers 18, 20.

The solder bodies 40 may be reflowed during a chip/substrate attach process. The chip carrying the pillars 42, 44 may be inverted and aligned relative to features, such as bond pads 48, on a substrate 46, such as a laminate package. The solder bodies 40 become metallurgically attached to the matching bond pads 48 during the reflow process. The temperature of the reflow process is dependent upon solder composition, but may be in a range of 200° C. to 300° C. Eventually, the pillar-type connections including the pillars 42, 44 provide electrical pathways for transferring data signals to and from the chip to an external device, such as a computing system, or electrical pathways for powering integrated circuits on the chip.

The pillars 42, 44 are not reflowable and, therefore, retain their shape during the reflow of the solder bodies 40, which contrasts with the collapse of solder bumps during solder reflow. The pillars 42, 44 further function to confine each solder body 40 during the chip/substrate attach process, which may reduce bulging of the solder bodies 40 after reflow and may reduce the susceptibility of the adjacent pillars 42, 44 to electrical shorting while maintaining electrical connectivity requirements. Specifically, the cup-shape of the recesses 36 acts as a small reservoir within the pillars 42, 44 to confine a portion of the solder body 40. The solder confinement may be beneficial as the pitch of the pillars 42, 44 is reduced for die-to-die and die-to-package connections in advanced semiconductor devices.

Figure 5:
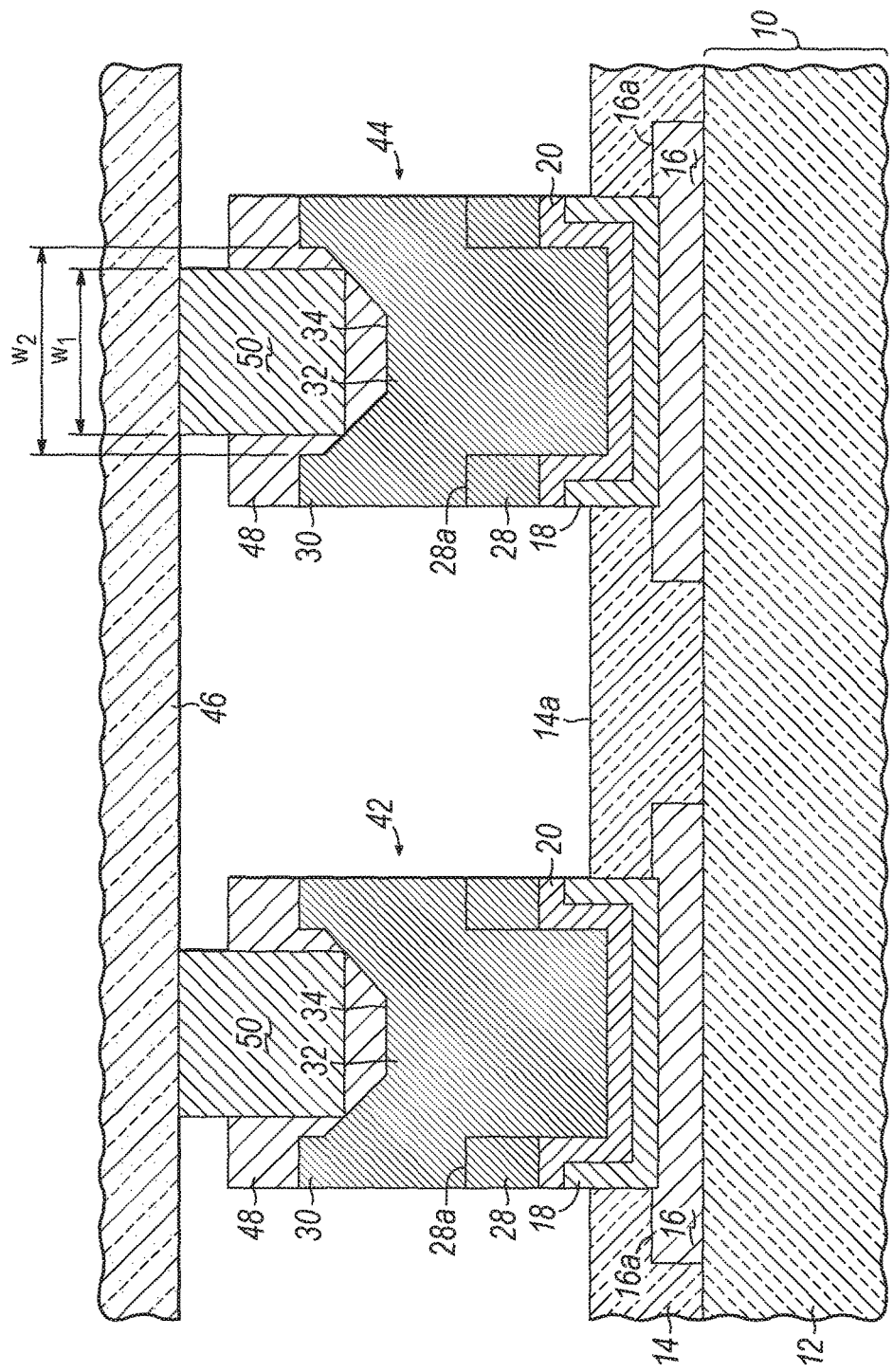
FIG. 5 is a cross-sectional view similar to FIG. 4 of a device structure fabricated by a processing method in accordance with an alternative embodiment.

With reference to FIG. 5 in which like reference numerals refer to like features in FIG. 4 and in accordance with an alternative embodiment, the shape of the surfaces 34 atop each of the pillars 42, 44 may be adjusted by adjusting factors such as the dimensions of the sacrificial plugs 26 and/or the height of the hollow conductive layer 28 before the sacrificial plugs 26 are removed. The result is that the surfaces 34 include short vertical surfaces aligned parallel to the sidewalls of the respective opening 24 in the plating mask 22, a horizontal surface at the base of the recess 36, and inclined surfaces connecting the horizontal surface and vertical surfaces to define a divot or u-shaped cavity. The various surfaces 34 may be symmetrical with respect to a center plane of the recess 36. The inclined surfaces 34 are angled relative to the sidewalls of the opening 24 in the plating mask 22. The shape of the surfaces 34 may arise from the convergence of multiple growth fronts during the deposition of the conductive layer 30 after the sacrificial plugs 26 are removed.

The recesses 36 in the pillars 42, 44 and the features represented by traces 50 on the substrate 46 may be commensurately dimensioned such that the traces 50 can be received by solder-filled recesses 36 during placement and reflow when the solder bodies 40 are molten. In particular, the width w1 of the traces 50 may be less than the width w2 between the inclined surfaces 34 such that the recesses 36 can receive the traces 50. The ability to place the traces 50 into the solder-filled recesses 36 may permit substrate 46 to be self-aligned relative to the pillars 42, 44. When the solder solidifies with the traces 50 received in the recesses 36, the traces 50 are respectively coupled with the pillars 42, 44. As the pitch of the pillars 42, 44 is reduced in advanced technologies, the ability to promote self-alignment between the pillars 42, 44 and the traces 50 may reduce yield loss and reliability problems due to inaccurate placement.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a pillar-type connection, the method comprising:
   forming a first conductive layer;
   forming a second conductive layer on the first conductive layer to define a conductive pillar that includes a top surface defining a recess aligned with a hollow core of the first conductive layer; and
   forming a conductive via that terminates at a top surface of the first conductive layer.

2. The method of claim 1, further comprising:
   forming a plating mask that includes an opening aligned with the conductive via; and
   forming a sacrificial plug within the opening.

3. The method of claim 2, further comprising:
adjusting the top surface of the conductive pillar using factors comprising at least one of dimensions of the sacrificial plug and height of the hollow core before removing the sacrificial plug.

4. The method of claim 3, wherein adjusting the top surface of the conductive pillar provides vertical surfaces aligned parallel to sidewalls of the opening in the plating mask and inclined surfaces connecting a horizontal surface and a vertical surface to define a cavity.

5. The method of claim 3, wherein the sacrificial plug has a top surface, and the first conductive layer is formed inside the opening by depositing the first conductive layer such that the top surface of the first conductive layer is recessed relative to the top surface of the sacrificial plug.

6. The method of claim 3, further comprising:
after the first conductive layer is formed, removing the sacrificial plug from within the opening, wherein the sacrificial plug is formed as part of a different plating mask.

7. The method of claim 6, wherein the second conductive layer is formed inside the opening and in contact with the first conductive layer after the sacrificial plug is removed.

8. The method of claim 6, further comprising:
attaching the conductive pillar to a feature on a package using a solder body, wherein the recess is dimensioned to receive the feature so that the feature is self-aligned with the conductive pillar during assembly.

9. The method of claim 1, wherein the top surface of the conductive pillar is non-planar.

10. A method of fabricating a pillar-type connection, the method comprising:
forming a second conductive layer on a first conductive layer to define a conductive pillar;
forming a conductive via that terminates at a top surface of the first conductive layer; and
adjusting a top surface of the conductive pillar using factors comprising at least one of dimensions of a sacrificial plug and height of a hollow core of the first conductive layer before removing the sacrificial plug.

\* \* \* \* \*